United States Patent [19]
D'Arrigo et al.

[11] Patent Number: 5,467,307
[45] Date of Patent: Nov. 14, 1995

[54] MEMORY ARRAY UTILIZING LOW VOLTAGE FOWLER-NORDHEIM FLASH EEPROM CELL

[75] Inventors: Iano D'Arrigo, Cannes; Georges Falessi, La Gaude, both of France; Michael C. Smayling, Missouri City, Tex.

[73] Assignee: Texas Instruments Incorporated, Dallas, Tex.

[21] Appl. No.: 135,694

[22] Filed: Oct. 12, 1993

[51] Int. Cl.$^6$ .................................................. G11C 11/34
[52] U.S. Cl. ...................... 365/185.06; 365/218; 257/549
[58] Field of Search ...................... 365/185, 218; 257/314, 315, 316, 549

[56] References Cited

U.S. PATENT DOCUMENTS

| | | | |
|---|---|---|---|
| 4,763,177 | 8/1988 | Paterson | 365/185 |
| 5,027,321 | 6/1991 | Park | 365/185 |
| 5,047,981 | 9/1991 | Gill et al. | 365/185 |
| 5,187,683 | 2/1993 | Gill et al. | 365/185 |
| 5,243,559 | 9/1993 | Murai | 365/185 |
| 5,297,081 | 3/1994 | Challa | 365/184 |
| 5,313,432 | 5/1994 | Lin et al. | 365/185 X |

Primary Examiner—David C. Nelms
Assistant Examiner—Son Dinh
Attorney, Agent, or Firm—Robert D. Marshall; James C. Kesterson; Richard L. Donaldson

[57] ABSTRACT

A Flash EEPROM memory array includes a plurality of transistor memory cells (24) arranged in rows and columns. The sources of the transistors (24) are connected to Virtual Ground Lines (29) and the drains thereof are connected to Column Lines (28). The memory cells (24) are programmable by Fowler-Nordheim tunneling. Each cell also includes an isolation structure having a first isolation tank of the first conductivity type material for surrounding each of the floating gate transistor memory devices and a second isolation tank of a second conductivity type material opposite to the first conductivity type surrounding the first isolation tank, allowing application of a negative voltage to the source or drain of the cell. Initially, all of the transistors are erased in the FLASH ERASE operation by disposing the Word Lines at a negative medium voltage and the Bit Lines at a positive medium voltage. Thereafter, selected transistors can be written to by selectively charging the floating gates in the transistors. This is achieved by disposing the Column Lines (28) of a select transistor at a negative voltage of a magnitude less than the programming voltage $V_{PP}$ and disposing the row line (26) of the select transistor at a positive voltage of a magnitude less than $V_{PP}$.

3 Claims, 4 Drawing Sheets

MEMORY ARRAY UTILIZING LOW VOLTAGE FOWLER-NORDHEIM FLASH EEPROM CELL

TECHNICAL FIELD OF THE INVENTION

The present invention pertains in general to an erasable, electrically programmable memory cell (EEPROM) and its related driving circuitry and, more particularly, to the layout structure utilizing a low voltage EEPROM cell.

CROSS REFERENCE TO RELATED APPLICATIONS

The present invention is related to U.S. patent application Ser. No. 08/135,695, copending herewith, which is entitled "Low Voltage Flash EEPROM X-Cell Using Fowler-Nordheim Tunneling," U.S. patent application Ser. No. 08/135,813, copending herewith, which is entitled "Low Voltage Flash EEPROM Memory Cell With Merge Select Transistor and Non-Stacked Gate Structure," and U.S. patent application Ser. No. 08/135,696, copending herewith, which is entitled "Low Voltage Fowler-Nordheim Flash EEPROM Memory Array Utilizing Single Level Poly Cells."

BACKGROUND OF THE INVENTION

Conventional EEPROMs typically employ three to four transistors, which include a tunnel diode device coupled to the floating gate of the sense transistor to charge the latter and a select or row transistor to activate the cell. The use of three or four transistors to realize a cell substantially limits the size reduction possible for EEPROM arrays. Furthermore, typical EEPROM cells require the application of voltages in excess of 15 volts. This therefore requires special processing to reduce leakage and a larger layout to avoid unwanted field transistor turn-on, i.e., the use of high voltage transistors typically have longer channel lengths, and therefore, significantly larger sizes. This is especially the case with respect to the row transistor, since high voltage is applied to the source during the ERASE mode. The peripheral driving circuitry also requires higher voltage transistors to handle these high voltage driving signals.

One technique for reducing the voltage is to utilize lower voltages during the programming and the ERASE modes with use of an asymmetric transistor. This is disclosed in U.S. Pat. No. 4,939,558, issued Jul. 30, 1990, which patent is incorporated herein by reference. U.S. Pat. No. 4,939,558, discloses an asymmetric memory cell that utilizes Fowler-Nordheim tunneling techniques, whereby a reach-through region is provided on only one side of the floating gate, such that the tunneling of electrons takes place only on the reach-through side of the gate and, as such, creates an asymmetry in the transistor for the purposes of both programming and erasure.

SUMMARY OF THE INVENTION

The present invention, disclosed and claimed herein comprises a Flash EEPROM memory array. The array includes a plurality of flash EEPROM memory cells, each containing a floating gate EEPROM cell, arranged in rows and columns, each having a source, a drain and a control gate and each programmable by Fowler-Nordheim electron tunneling. The array is arranged such that the memory cells are in a symmetric configuration. A plurality of Word Lines are disposed in a parallel configuration in the array, each associated with one of the rows of the memory cells and connected to the control gates of the memory cells in the associated row. A plurality of Bit Lines are provided, disposed orthogonal to the Word Lines, each associated with one of the columns of the memory cells and attached to the source or drain of the associated memory cells. A plurality of Bit Lines are disposed parallel to the Bit Lines, each associated with one of the columns of memory cells and attached to the other of the source or drains of the associated memory cells relative to the Bit Lines. A programming device is operable to selectively program a select single cell in the array by selectively applying predetermined voltages to the row lines, the Bit Lines and the virtual ground lines.

In another aspect of the present invention, each of the floating gate cells has a floating gate associated therewith that is operable to be negatively charged during a Write operation and positively charged during an Erase operation. The programming device is operable to apply a positive voltage to the Word Line and a negative voltage to at least one of the Word Lines or Bit Lines during one of the Erase or Write operations. During the other of the Erase or Write operations, a negative voltage is applied to the control gate and a positive voltage is applied to at least one of the Word Lines or Bit Lines.

In yet another aspect of the present invention, the programming device is operable to apply a full programming voltage between the control gate and at least one of the source and drains of the select single cell. The remaining memory cells have less than a full programming voltage disposed between the control gate and at least one of the source and drains thereof. The less than full programming voltage is at a level such that the previous programming of the non-selected memory cells is not disturbed. Further, the voltage applied to the control gate of the select cell is not a full programming voltage, such that a negative voltage is required on the one of the source or drains of the select cell. In order to accommodate a negative voltage, the memory cell, which is comprised of a floating gate transistor memory cell formed on the face of a substrate of the first conductivity type, is disposed in an isolation tank. The isolation tank is comprised of a first isolation tank of first conductivity type material for containing the transistor and biased at a voltage that is less than any voltage that can be applied to the source or drain of the associated transistor. The first isolation tank is contained within a second isolation tank of a second conductivity type material opposite to the first conductivity type material by and biased at a voltage greater than that of the first isolation tank.

In a further aspect of the present invention, the array is comprised of a plurality of source/drain regions of the second conductivity type disposed in evenly spaced columns and separated by channel regions, the source/drain regions in each column isolated from source/drain regions in adjacent columns. Each of the channel regions has a floating gate disposed thereover and separated therefrom by a layer of tunnel oxide that allows Fowler-Nordheim tunnelling to occur therethrough. A plurality of row lines are provided, each associated with one of the rows of memory cells, each of the row lines extending over the associated floating gates of the associated row and separated therefrom by a layer of interlevel oxide. A plurality of conductive Bit Line strips are provided, each disposed orthogonal to the row lines and associated with one of the columns of source/drain diffusions and electrically connected to alternating ones thereof. A plurality of conductive virtual ground line strips is provided, each disposed parallel to an associated one of the conductive Bit Line strips and electrically connected to alternating ones of the source/drain diffusions not connected

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
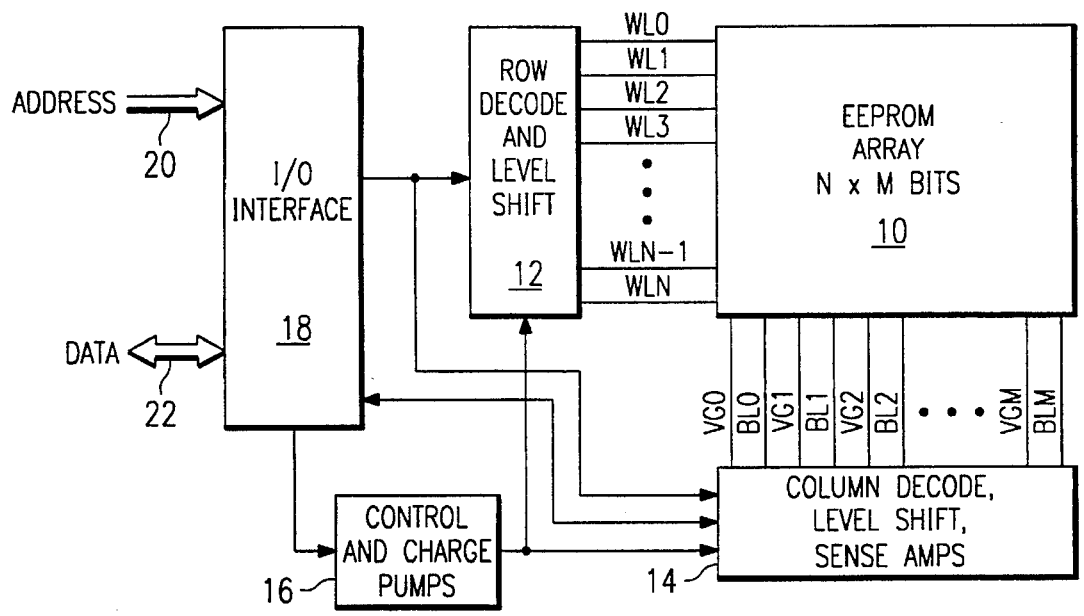
FIG. 1 illustrates a block diagram of the EEPROM.

Referring now to FIG. 1, there is illustrated a schematic block diagram of the architecture of an EEPROM memory which may stand alone as an independent integrated circuit, as well as being incorporated within a much higher level integrated circuit as a single module in that integrated circuit. The EEPROM memory includes an array 10 of memory cells which are arranged as N-rows and M-columns to provide an array of N×M bits. In a typical example, the array could be arranged to have 256 words with 8 bits per word, for a total of 2048 bits. These may be organized in an array of, for example, 32 rows by 64 columns, or 64 rows by 32 columns.

Each of the bits in the array 10 is associated with an EEPROM memory cell, as will be described hereinbelow. Each of the memory cells requires a dedicated Word Line, bit-line and Virtual Ground Line. A row decoder and level shifter 12 is provided for interfacing with the Word Lines to drive the Word Lines to the appropriate voltages. A column decoder, level shifter and sense amplifier section 14 is operable to drive the bit-lines and Virtual Ground Lines with the appropriate voltages and, during the Read operation, to attach the appropriate bit-lines to sense amplifiers and the appropriate Virtual Ground Lines to a desired voltage.

A block 16 includes circuitry for controlling the timing of the access to the EEPROM array 10 and charge pumps for providing control signals and appropriate voltages to the array 10, the row decode and level shift block 12 and the column decode, level shift and sense amplifier section 14. The control and charge pump block 16 is connected to an input/output (I/O) interface 18, which provides an interface with either the rest of the chip, or an external chip or device to receive address signals therefrom and also input and output data. The I/O interface 18 uses addresses from an address bus 20 and receives data from and transfers data to a data bus 22.

Figure 2:
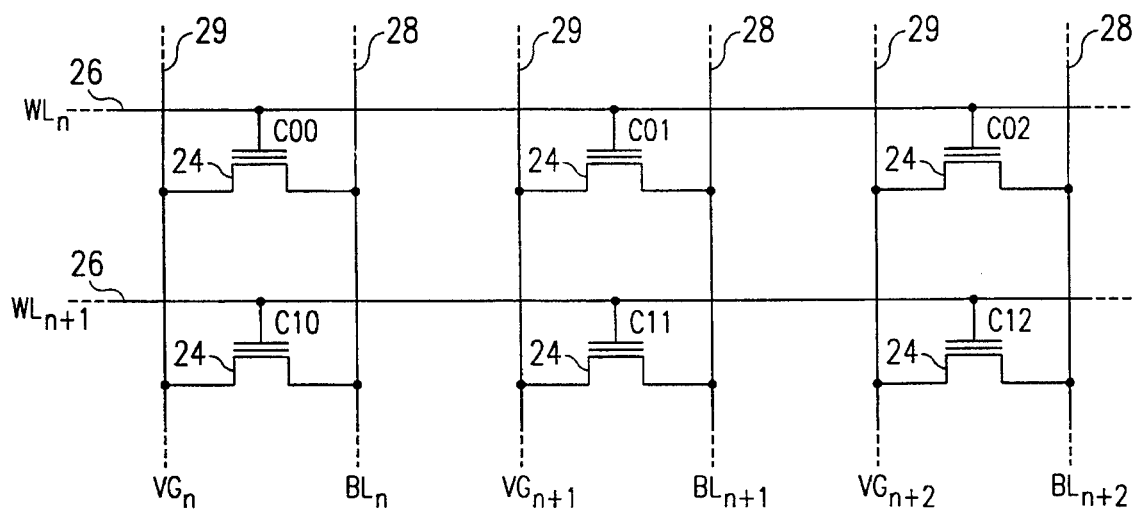
FIG. 2 illustrates a schematic diagram of the array.

Referring now to FIG. 2, there is illustrated a detailed diagram of the array. A plurality of EEPROM transistor cells 24 are provided which are arranged in rows of columns and incorporate the use of a floating gate transistor memory cell that utilizes Fowler-Nordheim tunneling for the programming operation thereof. A plurality of Word Lines 26 are provided, one associated with each row of memory cells 24, the Word Lines 26 connected to the control gates of the respective memory cells 24. A plurality of Column Lines 28 are provided, each associated with a column of the memory cells 24 and connected to the drains of the associated memory cells. Each of the Column Lines is designated as a Bit Line BL0, BL1 . . . BLN. Additionally, a plurality of Virtual Ground Lines 29 are provided, each associated with one column of the memory cells 24. Each of the Virtual Ground Lines 29 are connected to the sources of the associated memory cell transistors 24 in the associated column. The Virtual Ground Lines 29 are each labelled VG1, VG2 . . . VGN.

In the example of FIG. 2, there are illustrated two Word Lines $WL_n$ and $WL_{n+1}$, three Bit Lines $BL_n$, $BL_{n+1}$ and $BL_{n+2}$, and three Virtual Ground Lines $VG_n$, $VG_{n+1}$ and $VG_{n+2}$. Memory cell transistors 24 associated with the Word Line $WL_n$ are labelled C00, C01 and C02, for each of the respective Bit Lines $BL_n$-$BL_{n+2}$. Further, the three transistors 24 associated with the Word Line $WL_{n+1}$ are labelled C10, C11 and C12.

In order to Write to the cells, i.e., to negatively charge the floating gates, it is necessary to dispose the Word Lines 26 at a positive voltage, and the sources and drains of the memory cell transistor 24 at a negative voltage, to allow electrons to tunnel from the source side of each of the memory cells 24 to the floating gates thereof. This can be achieved in two ways. In one method, a high voltage level of approximately 18 volts can be disposed on all of the Word Lines 26, with the Column Lines 28 and Virtual Ground Lines 29 disposed at ground or zero volts. Alternately, and in the preferred embodiment, Word Lines 26 are disposed at a medium voltage of approximately 9 volts and the Column Lines 28 and Virtual Ground Lines 29 disposed at a negative medium voltage of −9 volts. In order to FLASH ERASE the cells, it is only necessary to dispose the Word Lines 26 at the negative medium voltage and the Column Lines 26 at the positive medium voltage.

In the programming mode of the present invention, the array is first subjected to a FLASH ERASE operation, and then a select cell subjected to a WRITE operation. In order to selectively WRITE one of the memory cell transistors 24, such that individual bit programming can be provided, it is necessary to dispose a positive voltage on the control gate of a select transistor relative to source and drain thereof. However, it is also important that the remaining voltages of the sources and drains of adjacent cells and other cells in the array be disposed at a voltage such that the charge on the floating gates thereof is not disturbed for unselected cells. For example, consider the memory cell transistor 24 labelled C11. The following Table 1 illustrates the voltages necessary for the FLASH WRITE, the WRITE the READ and FLASH ERASE operations.

TABLE 1

| MODE | $WL_n$ | $WL_{n+1}$ | $VG_n$ | $BL_n$ | $VG_{n+1}$ | $BL_{n+1}$ | $VG_{n+2}$ | $BL_{n+2}$ |
|---|---|---|---|---|---|---|---|---|
| Flash Write | +MV | +MV | MV | −MV | −MV | −MV | −MV | −MV |
|  | +HV | +HV | 0 V | 0 V | 0 V | 0 V | 0 V | 0 V |
| Write C11 | +HV/2 | +HV | Float | +HV/2 | Float | 0 V | Float | +HV/2 |
| Read C11 | −Vr | +Vr | 0 | Float | 0 v | Vs | 0 | Float |
| Flash Erase | −MV | −MV | Float | +MV | Float | +MV | Float | +MV | where:
HV = High Voltage (18 V)
MV = Medium Voltage (9 V)
Vr = Word Line Read Voltage (5 V ($V_{DD}$))
Vs = Bit Line Sense Voltage (1.2 V)

Initially, the Word Lines are all disposed at a positive medium voltage of, for example, 9 V and the Bit Lines disposed at a negative medium voltage of, for example, −9 V to remove all the negative charge from the floating gates of all of the memory cell transistors 24. The negative medium voltage may have the level thereof adjusted to ensure that the cells are not over erased, i.e., the threshold voltage thereof does not go negative. To Write to cell C11, the Word Line $WL_{n+1}$ is disposed at a high voltage of +18 V and the remaining Word Lines are disposed at a voltage of one half the high voltage, or +9 V. The Bit Line $BL_{n+1}$ is disposed at a value of zero volts, with the remaining Bit Lines disposed at a voltage of one half the high voltage, or +9 V, and all of the Virtual Ground Lines are allowed to float. Therefore, the tunnel diode of cell C11 will have a voltage of +18 volts disposed thereacross for the purpose of depleting charge from the associated floating gate without requiring the high node potentials necessary for a normal EEPROM cell. However, it is important to ensure that the other memory cells C10 and C12 in the same row having the control gates thereof attached to the Word Line $WL_{n+1}$, do not have the charge on the floating gates thereof disturbed, this referred to as a "write disturb" operation. This is achieved by disposing the Bit Lines associated with the non-selected cells in the row associated with Word Line $WL_{n+1}$ at the +9 V level, such that only +9 V is disposed across the associated tunnel diode of the non-selected cells. As such, the voltage is at an insufficient level to cause tunneling in the Fowler-Nordheim configuration.

With respect to the remaining cells on non-selected Word Lines, it can be seen that, since the voltage utilized on the Word Line of the non-selected cells is one half the high voltage level, with the associated Bit Lines of the non-selected cells disposed at a zero voltage level, there will be a lower voltage across the tunnel diode as compared to that of the selected cell C11. As such, the voltage is at an insufficient level to cause tunneling in the Fowler-Nordheim configuration. Alternatively, the Word Line of C11 could be disposed at a positive medium voltage of, for example, +9 V for the WRITE operation and the remaining Word Lines at a voltage of 0 V, with the Bit Line of the selected cell disposed at a negative medium voltage of, for example, −9 V, and the Bit Lines of the non-selected cells disposed at a zero voltage level. The use of the negative voltage and the positive voltage as opposed to ground and a single positive programming voltage allows the array to operate in a bit-programming mode without requiring the use of a separate control transistors and, thus, allows for much smaller array size.

Figure 3:
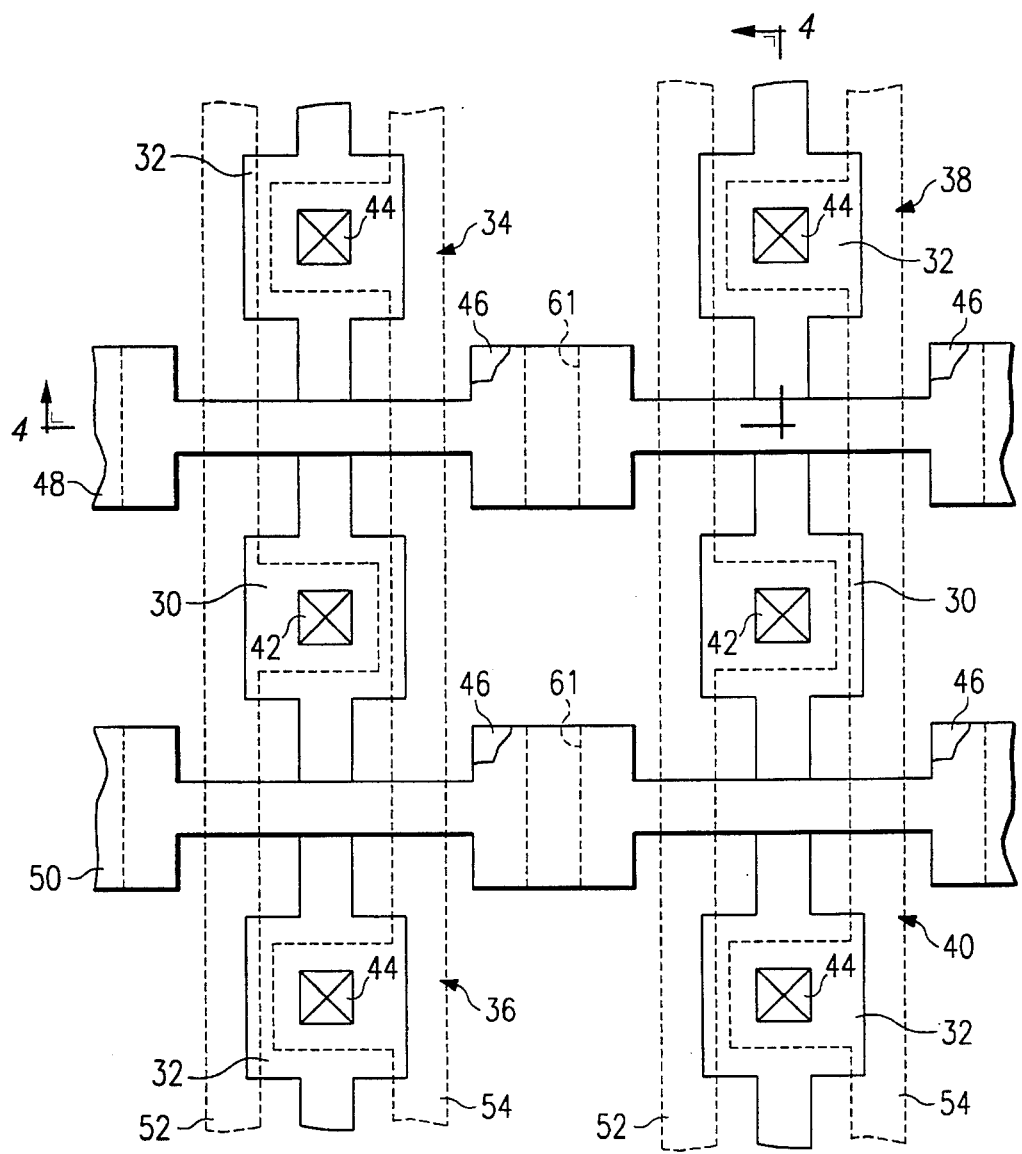
FIG. 3 illustrates a plan view of the layout for four transistors in the array.

Referring now to FIG. 3, there is illustrated a layout for the array of FIG. 2. A plurality of drain regions 30 and source regions 32 of N-type material are formed in the face of a semiconductor substrate. The source regions 32 and the drain regions 30 are arranged in each column in an alternating manner such that they each share two transistors with source regions 32 and drain regions 30 separated by a channel region of the respective transistors. Each of the drain regions 30 and the source regions 32 is composed of a centralized wide area with to two narrow areas that extend from either direction thereof along the length of the column to abut the channel of the respective transistors.

The array in FIG. 3 illustrates the formation of four transistors, 34, 36, 38 and 40, with transistors 34 and 36 being in one column and transistors 38 and 40 being in an adjacent column. Transistors 34 and 38 are in common row and transistors 36 and 40 are in a common row. Transistors 34 and 36 share a common drain region 30 and, similarly, transistors 38 and 40 share a common drain region 30. Each of the drain regions 30 has a contact 42 formed therein and each of the source regions 32 has a contact 44 formed therein. Each of the transistors 34–40 has a floating gate 46 associated therewith which overlies the channel region and overlaps the field oxide on either side of the channel, the floating gates 46 extending perpendicular to the columns. The floating gates 46 are formed of a first layer of polycrystalline silicon material (poly), which is separated from the channel region by a layer of oxide that is approximately 100 Å. After formation of the first poly layer, it is partially patterned to form the ends of the control gates 46 by patterning a "slot" extending parallel to the columns, the slot defining ends 61 on the floating gates 46. The floating gates 46 are then covered with a layer of interlevel oxide (ILO) and then a second poly layer formed over the floating gates 46 to form the control gates of the transistors and to form a continuous row line. Transistors 34 and 38 will have a row line 48 associated therewith and transistors 36 and 40 will have a row line 50 associated therewith. As will be described hereinbelow, the process for forming both the floating gates 46 and row lines 48 and 50 is a self-aligned "stacked" structure, wherein the layers of poly from which the floating gates 46 and the row lines 48 and 50 are both formed prior to any patterning and etching to define the floating gates and row lines. This structure is then subjected to a patterning and etch process to define the floating gates 46 and the row lines 48 and 50 with the edges thereof aligned, which edges are then utilized to define the channel of the respective transistors in a subsequent source/drain implant step.

It can be seen from the plan view of FIG. 3 that the array is "symmetric" and results in a much denser array, due to the fact that no control transistors are needed. Therefore, a minimum amount of space is required in order to realize the array structure of FIG. 3 in the face of a semiconductor substrate.

After formation at the row lines 48 and 50, another layer of interlevel oxide is disposed on the surface of the substrate, and the contacts formed with the source regions 32 and the drain regions 32. Bit Lines 52 are then formed on one side of the regions 30 and 32, and Virtual Ground Lines 54 formed on the opposite side thereof for each column. The Bit Lines 52 and Virtual Ground Lines 54 will run perpendicular to the row lines 48 and 50 and run parallel to each other such that a protrusion from each of the Bit Lines and Virtual Ground Lines will extend inward over either the drain regions 30 or the source regions 32. It can be seen that each of the Bit Lines 52 contacts the drain regions 30 and each of the Virtual Ground Lines 54 contact each of the source regions 32.

Figure 4:
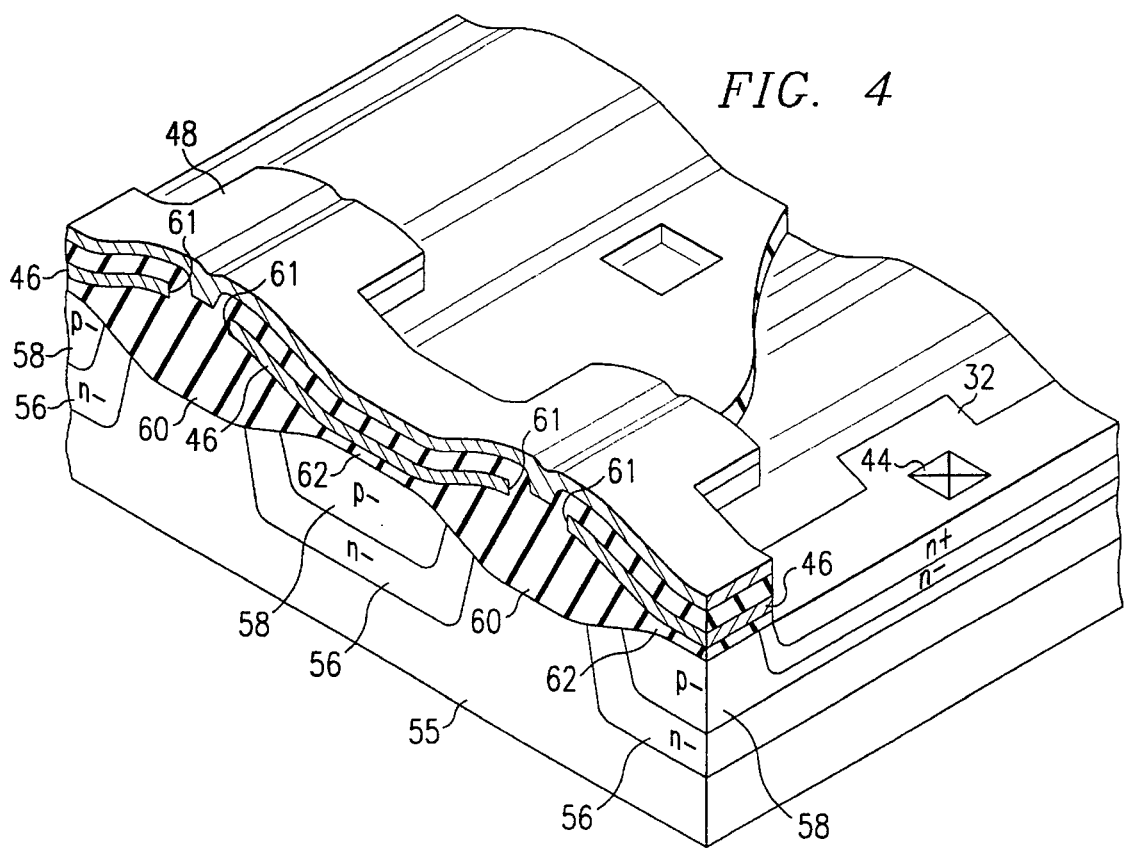
FIG. 4 illustrates a perspective cutaway view of two transistors in the array.

Referring now to FIG. 4, there is illustrated a cut-away perspective view of the array of FIG. 3 taken along line 4—4 through row line 48 and including transistor 34 and a portion of transistor 38. Initially, high voltage N-tanks 56 are formed by patterning a substrate and implanting N-type impurities into select areas at a relatively high implant voltage, followed by a second patterning step that defines a smaller area within the N− tanks 56 into which a low-voltage P− implant is performed, for example, with boron at approximately $1 \times 10^{14}$ ions/cm$^2$ at an implantation energy of approximately 40 KeV. The tanks are then driven into the substrate with an annealing step, such that tank 56 is deeper than tank 58. The formation of the high voltage and low voltage tanks is described in U.S. Pat. No. 5,225,700, issued Jul. 6, 1993, which is incorporated herein by reference. The low voltage P− tanks 58 will contain the NMOS transistor, whereas the N− tank 56 will provide a PN junction between the two tanks 56 and 58 that is reverse biased even when negative voltages exist within the P− tank 58.

After formation of the tanks 56 and 58, active regions are defined and patterned such that field oxide layers 60 can be defined therebetween to separate the active regions. This is followed by the formation of a thin layer of gate oxide of approximately 100 Å on the surface of the active regions that will result in the gate oxide layer 62 over the channel of the transistors, this being the tunnel oxide layer. Thereafter, a first layer of poly is formed on the surface of the substrate, followed by a layer of interlevel oxide (ILO) of approximately 300 Å thickness and a second layer of poly, the poly layers having a thickness of approximately 2,000 Å, techniques of forming the poly being conventional. After formation of both poly layers, a pattern and etch process results in formation of both the row lines 48 and 50 and the floating gates 46 in a stacked self-aligned structure. It can be seen that the edges of both the floating gate and the row line will be substantially aligned with each other and that the control gate for each of the transistors is common with the associated row line.

Figure 5:
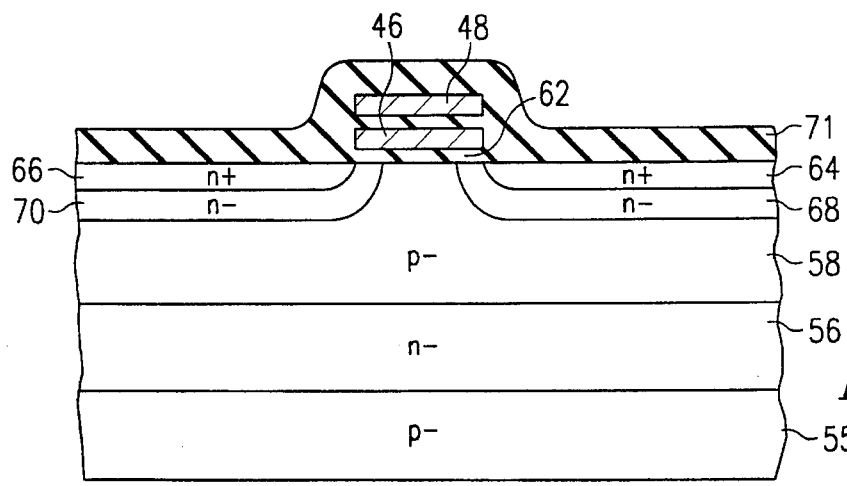
FIG. 5 illustrates a cross-sectional diagram across the channel of one transistor in the array.

Referring now to FIG. 5, there is illustrated a detail of each of the transistors in the structure of FIG. 4. After formation of the stacked gate structure of floating gate 46 and row line 48 (which comprises the control gate of the transistor), an arsenic implant is performed to create heavily doped source/drain regions 64 and 66. This is followed by a phosphorous implant dosage of approximately $8 \times 10^{14}$ to $2 \times 10^4$ ions per cm$^2$. The substrate 55 is then annealed at a temperature of approximately 950° to 1,000° C. to cause lateral diffusion of the phosphorous implant resulting in lightly doped regions 68 and 70, regions 68 and 70 underlying regions 64 and 66. It is noted that both regions 68 and 70 extend under the edge of the floating gate 46. As such, whenever a high voltage is disposed on the control row line 48 and a low voltage is disposed on the source/drain implant 66 or 64, Fowler-Nordheim tunneling will occur at the reach-through regions and the electrons will flow therethrough to the floating gates 46 to negatively charge the floating gates 46, thereby raising the threshold of the transistor. This is referred to as the tunnel diode. The channel region of the transistor is disposed in a P− tank 58 between the two regions 68 and 70 at the surface of the substrate. After formation of the source/drain regions 64 and 66, a layer of oxide 71 is disposed over the substrate, followed by formation of source/drain contacts (not shown) and the formation of metal layers (not shown) to contact various regions.

Figure 6:
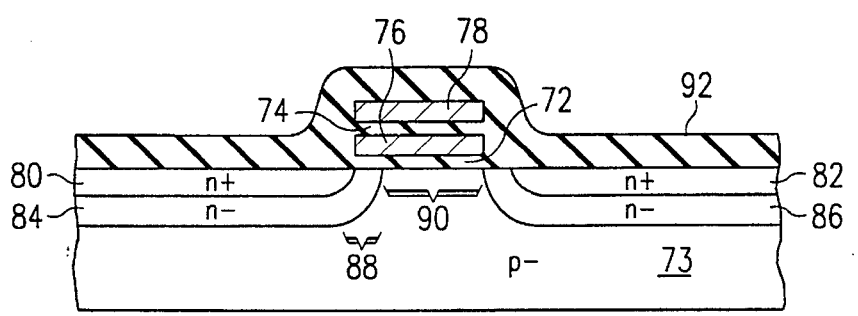
FIG. 6 illustrates a cross-sectional diagram of an asymmetric transistor as an alternate embodiment for the transistors in the array.

Referring now to FIG. 6, there is illustrated a cross-sectional diagram of an alternate embodiment of the transistors 34, 36, 38 and 40 of FIG. 3, which are referred to as asymmetric transistors. The asymmetric transistors allow for programming of only one side of the transistor, i.e., tunneling will occur on only one side of the transistor. This transistor is an N-channel transistor which is formed on a P-type substrate 73. The active region is formed in a conventional manner and, thereafter, a layer of thin oxide grown by thermal oxidation to a thickness of approximately 100 Å to form a gate oxide layer 72. A layer of polycrystalline silicon (Poly) is disposed over the entire surface using standard techniques to a thickness of about 2000 Å. It is then patterned to define the various floating gates and the separation therebetween. This is followed by the formation of the layer of gate oxide to a thickness of approximately 300 Å, which will form a gate oxide layer 74 between the floating gate and the control gate. This is followed by deposition of a second level Poly layer over the entire surface and then patterning and etching of both the first Poly layer and the second Poly layer to form a floating gate 76 and a control gate 78, this being a self-aligned process. As such, the floating gate 76 will be separated from the substrate 73 by the thin gate oxide layer 72, the tunnel oxide layer, and the control gate 78 will be separated from the floating gate 76 by the thicker gate oxide layer 74.

Following the formation of the floating gate 76 and control gate 78, a layer of oxide is formed over the entire surface to provide a conformal layer of oxide. This layer is then subjected to a directional or anisotropic etch using a plasma etch, as disclosed in U.S. Pat. No. 4,297,162, for example, to remove the oxide on all horizontal surfaces and leave sidewall oxide layers on the sidewalls of the floating gate 76 and control gate 78. This is a conventional technique. Thereafter, a resist layer is applied and patterned followed by an oxide removal process, such that only one of the sidewall oxide layers will remain. This will remove the sidewall oxide layer from the source side of the transistor.

The photoresist layer is removed and then an arsenic implant is performed to create heavily doped source/drain regions 80 and 82. This is followed by a phosphorous implant to a dosage of approximately $8 \times 10^{14}$ to $2 \times 10^4$ ions per cm$^3$. The substrate is then annealed at a temperature of approximately 950° C. to 1000° C. to cause lateral diffusion of the phosphorous implant, resulting in lightly doped regions 84 and 86, region 84 underlying region 80 and region 86 underlying region 82. It is noted that region 84 underlies a portion of the floating gate 76. This is referred to as a reach-through region 88, it being noted that, due to the way the sidewall oxides were formed, that the region 86 does not undercut the floating gate 76. As such, whenever a high voltage is disposed on the control gate 78 and a low voltage disposed on the source/drain implant 80, comprising the source of the transistor in this example, Fowler-Nordheim tunneling will occur at the reach-through region 80 and electrons will flow therethrough to the floating gate 76 to negatively charge the floating gate 76, thereby raising the threshold of the transistor. The channel region of the transistor comprises an area 90 disposed between the regions 84 and 86.

After formation of the source/drain regions 82 and the reach-through region 88, a layer of oxide 92 is disposed over the substrate, followed by formation of source/drain contacts (not shown) and the formation of metal layers (not shown) to contact the various regions. The structure of the transistor of FIG. 6 is disclosed in U.S. Pat. No. 4,742,492, issued May 3, 1988, which is incorporated herein by reference.

Figure 7:
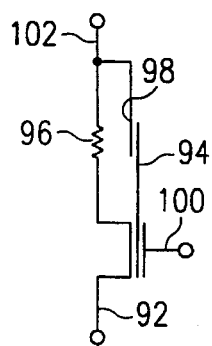
FIG. 7 illustrates an equivalent circuit for the transistor structure of FIG. 6.

Referring now to FIG. 7, there is illustrated an equivalent circuit for the transistor of FIG. 6. The transistor consists of a drain 92, a floating gate 94, a body resistance 96 corresponding to the reach-through region 88 and a tunnel diode 98. The tunnel diode 98 constitutes the reach-through path of the reach-through region 88 overlapped by the floating gate 94. A control gate 100 is disposed over the floating gate and a source 102 is connected to the other side of the body resistance 96. With the drain 92 floating, the source 102 disposed at ground potential and a high voltage applied to a control gate 100, tunneling of electrons will occur across the oxide layer 72 in the reach-through region 88. This will charge the floating gate negatively. This corresponds to a WRITE operation. In an ERASE mode, the drain 92 will again float, the source 18 will be disposed at a positive voltage, in one embodiment the medium voltage, and a negative medium voltage will be applied to the control gate 100. This will cause electrons to tunnel from the floating gate 94 to the reach-through region 88 and charge the floating gate 94 positively.

In the READ mode, the source 102 is disposed at a precharged voltage and then a voltage of 3.0 volts is disposed on the control gate 100, which is connected to the row line of the array when the transistor is selected. If it is not selected, a voltage of −3.0 volts is disposed on the control gate of the transistor. With a negatively charged floating gate 94, no current will flow through the channel and the pre-charge voltage will therefore remain constant. However, if the floating gate 94 has been positively charged, then current will flow from the source 102 to the drain 92 and the precharged voltage will fall. This is then sensed by the sense amplifier. However, an alternate method can be utilized, wherein the Bit Line is precharged and the source of the transistor disposed at ground and the sense amplifier then sensing the precharged voltage to determine if the transistor is conductive.

Figure 8:
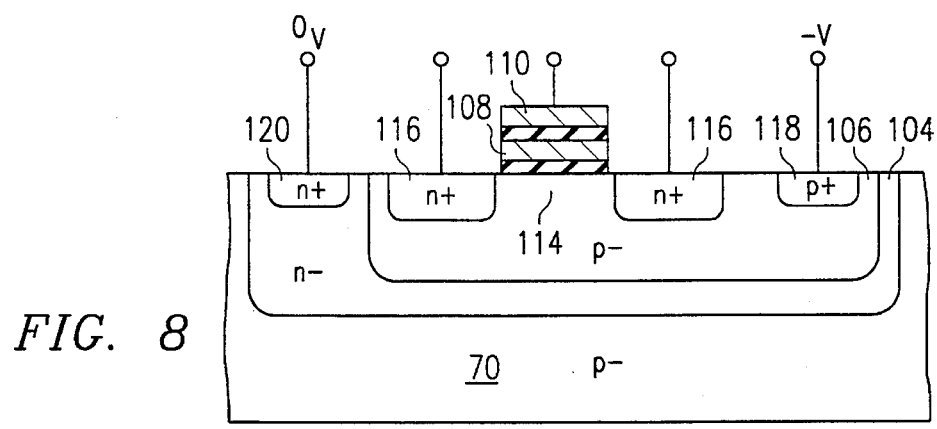
FIG. 8 illustrates a cross-sectional diagram of the high voltage tank.

Referring now to FIG. 8, there is illustrated a more detailed diagram of how the transistor is protected from unwanted parasitic transistors. In this technique, the substrate 73 has an N− well 104 formed therein by implanting a low dosage of N-type impurities into the substrate 73. This is followed by the formation of a P− region 106 within the N− region 104. The regions are driven into the substrate 73 by an annealing process such that the region 104 is driven deeper than the region 106 and, therefore, the N− region 104 surrounds the P− region 106. Thereafter, a transistor is formed with a stacked gate comprised of a floating gate 108 and control gate 110 formed over a channel region 114. Thereafter, N+ source/drain regions 116 are formed on either side of the channel region 114 in accordance with the techniques described above with respect to FIG. 5. A P+ contact region 118 is formed in the P− region 106 and an N+ contact region 120 is formed in the N− region 104. The N+ region 120 is disposed at a ground reference voltage and the P− region 106 is disposed at a negative voltage relative to the N− region 104. As such, the PN junction between regions 104 and 106 will be reverse biased and, therefore, the current will not flow. Therefore, whenever the source of the transistor at one of the source/drain regions 116 is disposed at a negative voltage relative to the P− substrate 73, conduction will not occur across the PN junction. This constitutes a high voltage tank structure, which is described in U.S. Pat. No. 5,157,281, issued Oct. 20, 1992, which is incorporated herein by reference.

Figure 9:
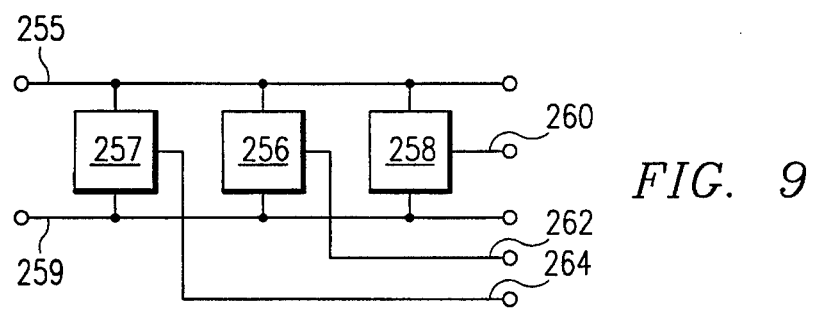
FIG. 9 illustrates a block diagram of the electrical circuit for providing the various voltage levels required by each cell in the array.
Figure 10:
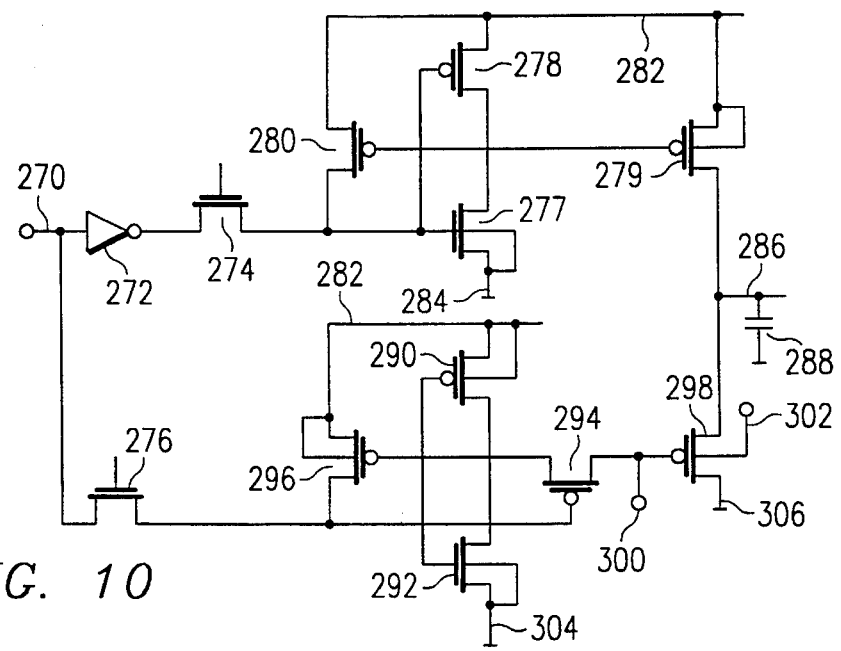
FIG. 10 illustrates a schematic diagram of a circuit for driving each Word Line of the array.

The circuitry required to drive the cells 24 illustrated in FIG. 2 is indicated by FIGS. 9 and 10. FIG. 9 shows a block diagram form the circuit required to produce the bipolar voltage levels required while FIG. 10 shows a switching circuit required to drive each line with a voltage required for a particular mode of operation.

In FIG. 9, a single voltage source of, for example, 5 volts is used as an input along line a 255 with a line 259 being ground or substrate voltage. Three charge pumps 257, 256 and 258 the design of which are well known in the art are coupled in parallel across lines 258 and 259. Each charge pump 257, 256 and 258 produces output voltages $-V_{gg}$, $-V_{pp}$ and $+V_{pp}$ on associated output lines 264, 262 and 260, respectively.

The circuit of FIG. 10 functions in response to input control signals received on input line 270 which are fed in parallel to an inverter 272 and through the source-to-drain of a field effect transistor 276 whose gate is at $V_{dd}$ or +5 volts. The inverter 272 output also passes through a field effect transistor 274 whose gate is at $V_{dd}$ or +5 V. The output from transistor 274 couples in parallel to the gates of an N-channel transistor 277 and a P-channel transistor 278 and to the drain of a P-channel transistor 280 to which the source of transistor 280 connects to the $V_{pp}$ line 282 and its gate connects to the drain of transistor 277. The source of transistor 277 is connected to ground at a $V_{ss}$ line 284 while the source of transistor 278 is connected to the $V_{pp}$ line 282.

The output from transistor 276 couples to the gates of transistors 290, 292 and 294, with transistors 290 and 294 being P-channel transistors. The drains of transistors 290 and 292 couple to the gate of transistor 296 and to the source of transistor 294. The drain of transistor 294 couples both to a $V_{gg}$ line 300 and to the gate of a P-channel transistor 298. Transistor 296 has the source thereof connected to the $V_{pp}$ line 282 and the drain thereof connected an output of transistor 276. The source of transistor 290 connects to the $V_{pp}$ line 282 while the source of transistor 292 is connected to the $V_{ss}$ line 304.

Output transistor 279 has the source thereof connected to the $V_{pp}$ line 282 and the drain thereof connected to the output line 286 while its complementary driver transistor 298 has the drain thereof connected to the $-V_{pp}$ line 306 and the source thereof connected to the line 286. Line 286 is charged and discharged by output capacitor 288 connected to $V_{ss}$.

In operation, a zero voltage input on input line 270 results in a positive signal at the output of inverter 272 which is applied to the gates of transistors 277 and 278. In response, transistor 277 turns on grounding the gates of transistors 279 and 280 and turning on both of the latter. Thus, transistor 279 in turning on connects the $V_{pp}$ line 282 to the output line 286. The charge pump 258 is operative to charge capacitor 288 to $+V_{pp}$. Simultaneously, transistor 280 couples $V_{pp}$ line 282 to the gates of transistors 277 and 278 thereby maintaining transistor 277 in an ON state and ensuring that there is no net voltage across the source-gate of transistor 278 so that the latter is cut off. Transistor 274 blocks the transmission of $V_{pp}$ to the output of inverter 272. Thus, capacitor 288 is charged through the channel resistance of transistor 279 to $V_{pp}$.

A zero input applied through transistor 276 turns on transistors 290 and 294 coupling +$V_{pp}$ on line 282 to the gate of transistor 298 and maintaining the latter OFF.

With an input signal at a logic "1", inverter 272 applies a logic "0" signal to the gates of transistors 277 and 278 turning on transistor 278 and applying $V_{pp}$ on line 282 to the gate of transistor 279. Transistor 279 is thus turned and/or maintained OFF.

An input signal at the logic "1" state turns on transistor 292 which applies zero volts to the source of transistor 294 and maintains the latter off. The $-V_{gg}$ and $-V_{pp}$ charge pumps 257 and 256 are then activated and transistor 298 turns on charging line 286 towards $-V_{pp}$. At the same time the $V_{pp}$ line 282 is tied to $V_{dd}$ lines 255.

Clearly, a variety of different voltages could be produced by the circuit of FIG. 9 depending upon the requirements. For the cells of FIG. 1, the combination +18v, +9 V, –9v and 3.0v, 0v and –3v would be appropriate for the row line, and +9v and 0v for the bit or read line.

In summary, there has been provided a Flash EEPROM array utilizing floating gate Flash EEPROM memory cells. The memory cells utilizing Fowler-Nordheim tunneling and are arranged in rows and columns with the sources thereof connected to Virtual Ground Lines and the drains thereof connected to Column Lines. The control gates of each of the transistors are connected to respective row lines. In order to FLASH ERASE all of the transistors, it is necessary to dispose all of the row lines at a negative voltage and the Bit Lines at a positive voltage with the ground lines allowed to float. Thereafter, select ones of the cells can be written to by utilizing medium voltages. For example, the Bit Line of the selected cell can be disposed at a zero voltage whereas the row line of select transistors are disposed at a programming voltage. The row lines of the remaining transistors are disposed at a voltage of one-half the programming voltage, such that the remaining transistors in the row associated with the select transistor have a lower node voltage associated therewith and, therefore, will not have the information stored therein disturbed. Therefore, no control transistor is necessary for individual bit programming. The layout for the array therefore lends itself to symmetry to provide a more dense structure.

Although the preferred embodiment has been described in detail, it should be understood that various changes, substitutions and alterations can be made therein without departing from the spirit and scope of the invention as defined by the appended claims.

What is claimed is:

1. A memory array, comprising:

a plurality of electrically erasable, non-volatile memory cells, each comprising a floating gate, non-volatile device arranged in rows and columns, each having a source, a drain and a control gate and programmable by Fowler-Nordheim electron tunneling by the application of at least a predetermined voltage ("the programming voltage") between the control gate and source thereof, and said floating gate devices being formed in the face of a semiconductor substrate of a first conductivity type and further comprising an isolation structure having a first isolation tank of the first conductivity type material for surrounding each of said floating gate transistor memory devices and a second isolation tank of a second conductivity type material opposite to the first conductivity type surrounding said first isolation tank, the memory cells arranged in a symmetric layout;

a plurality of word lines, each associated with one of the rows of said memory cells and connected to the control gate of each of the associated memory cells;

a plurality of bit lines, each associated with one of the columns of said memory cells and attached to one of the sources or drains of said associated memory cells;

a plurality of virtual ground lines, each associated with one of the columns of said memory cells and attached to the other of the sources or drains of said associated memory cells not connected to said bit lines; and a programming device for selectively programming a select single memory cell and selectively applying a predetermined voltage to said row lines less than a full programming voltage and a negative voltage to either or both of said bit lines and virtual ground lines.

2. A flash EEPROM memory array, comprising:

a plurality of Flash EEPROM memory cells, each comprising a floating gate, EEPROM device arranged in rows and columns, each having a source, a drain and a control gate and programmable by Fowler-Nordheim electron tunneling by the application of at least a predetermined voltage ("the programming voltage") between control gate and source thereof, the memory cells arranged in a symmetric layout;

a plurality of word lines, each associated with one of the rows of said memory cells and connected to the control gate of each of the associated memory cells;

a plurality of bit lines, each associated with one of the columns of said memory cells and attached to one of the sources or drains of said associated memory cells;

a plurality of virtual ground lines, each associated with one of the columns of said memory cells and attached to the other of the sources or drains of said associated memory cell not connected to said bit lines; and a programming device for selectively programming a select single memory cell and selectively applying a predetermined voltages to said row lines, bit lines and virtual ground lines wherein said programming device is operable to apply, during an erase or a write operation, a full programming voltage between the control gate and at least one of the source or drain of said select single memory cell, said full programming voltage being negative on said at least one of the said source and drain, and less than the full programming voltage between the control gate and at least one of the sources or drains of the non-selected ones of said memory cells, the less than full programming voltage being at a level that will not disturb the previous programming on the non-selected memory cells, wherein each of said floating gate cells comprises a floating gate transistor memory device formed in the face of a semiconductor substrate of a first conductivity type material and further comprising an isolation structure having a first isolation tank of said first conductivity type material for surrounding each of said floating gate transistor memory device and biased to a voltage less than any voltage that may be applied to the source or drain of said associated memory cell and a second isolation tank of a second conductivity type material opposite to the first conductivity type and biased at a voltage that is greater than the voltage at which said first isolation tank is biased.

3. A Flash EEPROM memory array, comprising:

a plurality of electrically erasable, non-volatile Flash EEPROM memory cells, each comprising a floating gate, non-volatile EEPROM device arranged in rows and columns, each having a source, a drain and a control gate and programmable by Fowler-Nordheim electron tunneling, and said floating gate devices being formed in the face of a semiconductor substrate of a first conductivity type and further comprising an isolation structure having a first isolation tank of the first conductivity type material for surrounding each of said floating gate transistor memory devices and a second isolation tank of a second conductivity type material opposite to the first conductivity type surrounding said first isolation tank, the memory cells arranged in a symmetric layout;

a plurality of word lines, each associated with one of the rows of said memory cells and connected to the control gate of each of the associated memory cells;

a plurality of bit lines, each associated with one of the columns of said memory cells and attached to one of the sources or drains of said associated memory cells;

a plurality of virtual ground lines, each associated with one of the columns of said memory cells and attached to the other of the sources or drains of said associated memory cells not connected to said bit lines; and a programming device for selectively programming a select single memory cell and selectively applying a predetermined voltage voltages to said row lines less than a full programming voltage and a negative voltage to either or both of said, bit lines and virtual ground lines, wherein the array is formed in the face of a semiconductor substrate of a first conductivity type, and the array comprises:

a plurality of source/drain regions of a second conductivity type opposite said first conductivity type and disposed in evenly spaced columns and separated by channel regions in each of said columns, said source/drain regions in each of said columns isolated form the source/drain regions in adjacent one of said columns;

each of said channel regions having a floating gate disposed thereover and separated therefrom by a layer of tunnel oxide that allows Fowler-Nordheim tunneling to occur therethrough;

a plurality of row lines, each associated with one row of said memory cells and each of said row lines disposed over each of said floating gates in the associated one of said rows and separated therefrom by a layer of interlevel oxide that allows said row line to function as the control line for said associated memory cells;

a plurality of conductive bit line strips, each disposed along an associated one of said columns of said source/drain diffusion and electrically connected to alternating ones thereof;

a plurality of conductive virtual ground line strips, each; disposed along an associated one of said columns of said source/drain diffusions and electrically connected to alternating ones thereof not connected to said associated conductive bit line strip, wherein said programming device is operable to apply a negative voltage to at least said bit lines or said virtual ground lines, and further comprising:

a first isolation tank for being disposed about each of said memory cells and being of said first conductivity type and biased at a voltage less than any voltage that can be applied to said source/drain regions; and a second isolation tank of said second conductivity type material disposed about said first isolation tank and biased at a voltage greater than the voltage of said substrate or the voltage to which said first isolation tank is biased.

* * * * *